United States Patent [19]
Tanski

[11] Patent Number: 5,214,338
[45] Date of Patent: May 25, 1993

[54] ENERGY COUPLER FOR A SURFACE ACOUSTIC WAVE (SAW) RESONATOR

[75] Inventor: William J. Tanski, Glastonbury, Conn.

[73] Assignee: United Technologies Corporation, Hartford, Conn.

[21] Appl. No.: 438,667

[22] Filed: Nov. 17, 1989

Related U.S. Application Data

[63] Continuation-in-part of Ser. No. 274,453, Nov. 21, 1988, abandoned.

[51] Int. Cl.⁵ ............................................. H01L 41/08
[52] U.S. Cl. .............................. 310/313 B; 310/313 R; 310/313 D
[58] Field of Search ........... 310/313 R, 313 B, 313 C, 310/313 D; 333/153, 154, 195, 191

[56] References Cited

U.S. PATENT DOCUMENTS

| | | | |
|---|---|---|---|
| 3,970,970 | 7/1976 | Worley | 310/313 D |
| 4,013,834 | 3/1977 | Kino et al. | 310/313 R X |
| 4,016,514 | 4/1977 | Reeder et al. | 310/313 R X |
| 4,041,419 | 8/1977 | Desormiere et al. | 310/313 R X |
| 4,191,933 | 3/1980 | Montress et al. | 333/191 |
| 4,442,574 | 4/1984 | Wabuga et al. | 310/312 X |
| 4,473,767 | 9/1984 | Minagawa et al. | 310/313 D |
| 4,628,222 | 12/1986 | Lewis | 310/313 R |
| 4,745,378 | 5/1988 | Niitsuma et al. | 333/196 |

FOREIGN PATENT DOCUMENTS 2078041 12/1981 United Kingdom ............... 333/195

OTHER PUBLICATIONS

High Q, Temperature Stable ZnO-on-Silicon SAW Resonators, by S. J. Martin et al, 1980 Ultrasonics Symposium, pp. 113-117.

Primary Examiner—Mark O. Budd
Attorney, Agent, or Firm—McCormick, Paulding & Huber

[57] ABSTRACT

A novel surface acoustic wave (SAW) element for use in a stabilized oscillator circuit capable of coupling directly to external circuitry includes a pair of opposed transducers formed on a surface of a piezoelectric crystal for launching surface acoustic waves into a resonant cavity formed by opposed reflectors on the crystal surface. The element is characterized by a supplemental transducer coupled to the cavity for directly providing external circuitry with signals corresponding to the resonant surface acoustic waves.

10 Claims, 2 Drawing Sheets

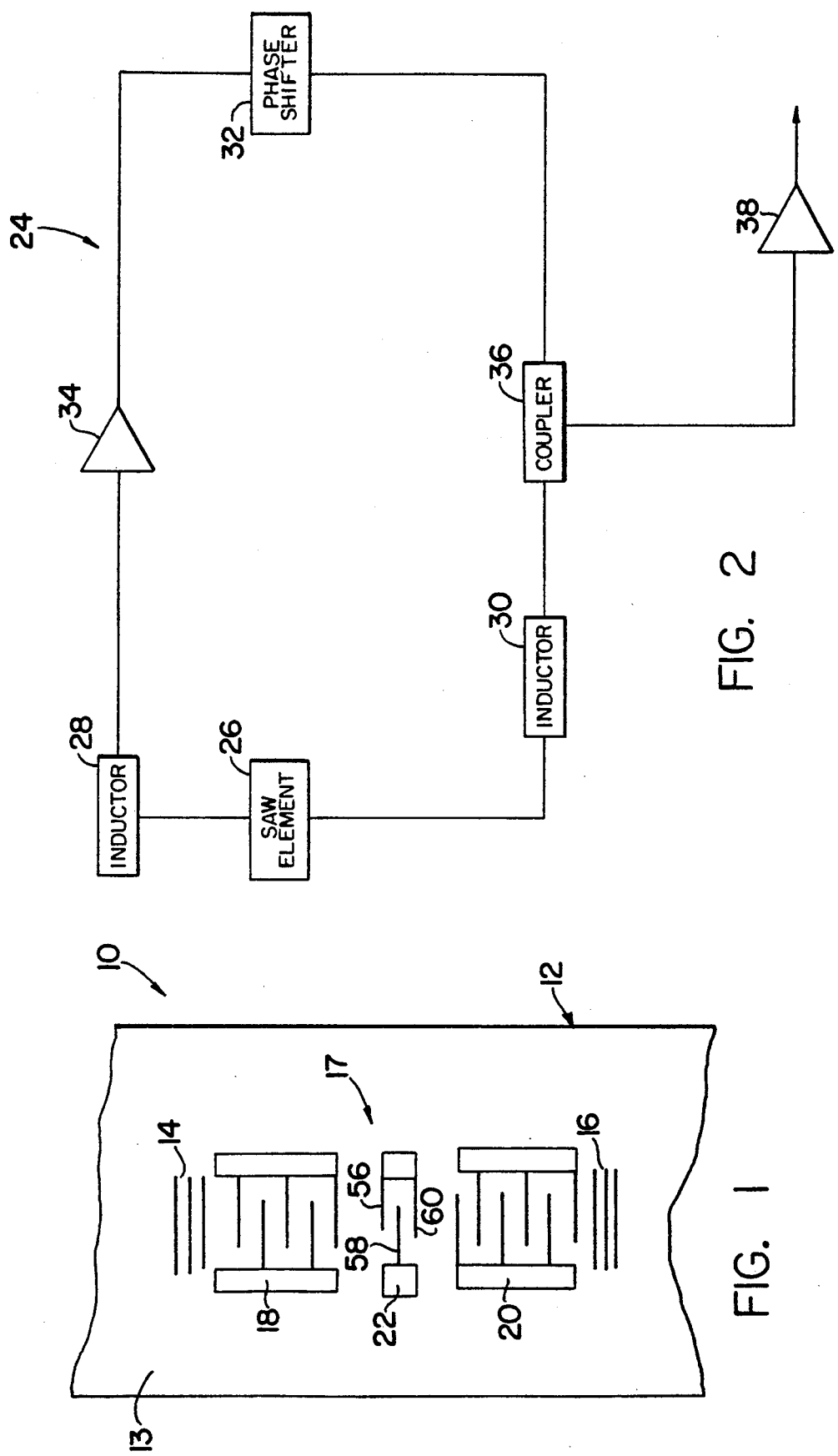

ENERGY COUPLER FOR A SURFACE ACOUSTIC WAVE (SAW) RESONATOR

This is a Continuation-in-part of co-pending application Ser. No. 274,453 filed on Nov. 21, 1988 now abandoned.

TECHNICAL FIELD

This invention relates to surface acoustic wave (SAW) devices and more particularly to a mechanism for energy coupling from a surface acoustic wave resonator.

BACKGROUND OF THE INVENTION

Surface acoustic wave (SAW) devices are well known in the art. These devices have found use in a variety of applications, particularly in stabilizing oscillator circuits in radar systems. For example, Doppler type radars require a very low noise frequency source in order to enhance the detectability of weak signals in a noisy background. These frequency sources (excitors) must generate several frequencies in the gigahertz range and they must be able to switch between frequencies rapidly. Surface acoustic wave resonators are used in oscillator circuits to generate signals at frequencies between 100 MHz and 1 GHz.

The surface acoustic wave resonant typically consists of a piezoelectric crystal, such as quartz, on which are placed two distributed reflectors. The reflectors are configured on the surface to form a resonant cavity which contains surface acoustic waves generated by a interdigitated transducers (IDT). The resonant condition created is similar to the conventional microwave and optical Fabry-Perot cavities, with the surface acoustic wave reflectors having a relatively narrow bandwidth, on the order of 0.5 percent.

Surface acoustic wave resonators have been used to stabilize voltage controlled oscillators. Oscillator circuits of the type used in Doppler radars comprise a surface acoustic wave resonator, corresponding inductors, a phase shifter and an amplifier. In voltage controlled oscillators having a surface acoustic wave resonator, power is coupled out of the resonant circuit by means of a directional coupler of the type known in the art. The directional coupler is typically configured to couple power from the resonant circuit from an amplified output signal. The directional coupler both extracts a minimal amount of energy from the oscillator circuit in a controlled manner for amplification, and isolates the oscillator circuit. Isolation is critical to the establishment and maintenance of a high degree of stability. Isolation is achieved by minimizing the amount of energy coupled from a resonator and also by eliminating the effect that external circuitry may have thereon.

It would be advantageous to have a surface acoustic wave resonator for use with a voltage controlled oscillator capable of direct signal coupling to the output amplifier, thereby eliminating the need for a separate directional coupler. The present invention is drawn towards such a resonator.

BRIEF DESCRIPTION OF THE DRAWINGS

FIG. 1 is a simplified schematic illustration of a surface acoustic wave resonator characterized by direct output coupling provided according to the present invention.

FIG. 2 is a simplified schematic illustration of a known oscillator circuit.

SUMMARY OF THE INVENTION

Figure 4:
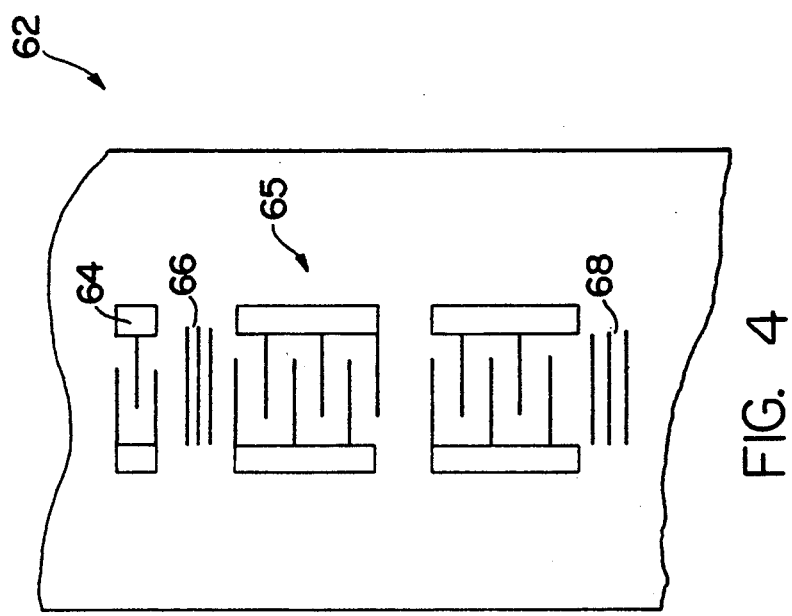
FIG. 4 is an alternative surface acoustic wave resonator to that illustrated in FIG. 1.

An object of the present invention is to provide a surface acoustic wave resonator for use with an oscillating electrical circuit characterized by direct coupling of energy at a resonant frequency to external electrical circuitry.

Another object of the present invention is to provide for a voltage controlled oscillator circuit stabilized by a surface acoustic wave resonator coupled to the oscillator circuit without a separate directional coupling element.

According to the present invention a surface acoustic wave (SAW) element for use in a oscillating electrical circuit includes a piezoelectric crystal having a polished surface and a first transducer formed on the polished surface for receiving electrical signals and launching surface acoustic waves therealong. A resonant cavity including opposed reflectors is configured with polished surface to receive the surface acoustic waves and generate corresponding standing acoustic waves at a resonant frequency. A second transducer is formed on the polished surface opposed to the first transducer for generating electrical signals at the resonant frequency from the standing acoustic waves. A third transducer is formed on the polished surface coupled to the resonant cavity for generating electrical signals whose magnitude corresponds to a selected portion of the acoustic energy in the resonant cavity at the resonant frequency.

According to another aspect of the present invention a surface acoustic wave resonator stabilized oscillator circuit includes a surface acoustic wave resonator element having a piezoelectric crystal with a polished surface and a first transducer formed on the polished surface for receiving electrical signals and launching surface acoustic waves along the polished surface. A resonant cavity including opposed reflectors is configured with the polished surface that receives the surface acoustic waves and generates corresponding standing acoustic waves at a resonant frequency. A second transducer is formed on the polished surface opposed to the first transducer for generating electrical signals at the resonant frequency from the standing acoustic waves. A third transducer is formed on the polished surface coupled to the resonant cavity for outputting from the circuit electrical signals whose magnitude corresponds to a selected portion of the acoustic energy in the resonant cavity at the resonant frequency. Also included in a phase shifter which receives the output signal of the surface acoustic wave element and provides signals of a selected phase to an input of an amplifier whose amplified output signal serves as the input signal to the surface acoustic wave element.

DESCRIPTION OF THE PREFERRED EMBODIMENT

Referring now to FIG. 1 there is a simplified illustration of a surface acoustic wave element provided according to the present invention. The element 10 is comprised of a quartz crystal 12 configured with the crystal graphic direction of the surface normal (crystal cut) chosen to be the ST (42.75 degree rotated Y axis) cut for temperature stability. Reflectors 14 and 16 is described hereinbelow are fabricated on a polished surface 13 to form a resonant cavity 17. The reflectors are preferably of etched groove construction to minimize losses and reduce the aging rate of the element. The element 10 is a two port device whose input transducer 18 and output transducer 20 are fabricated as recessed aluminum transducers because they demonstrate very low acoustic reflectivity on quartz and generate signals with lower distortion and acoustic losses. In addition, recessed aluminum transducers are easily fabricated and have very good long term aging rates, as low as 0.1 parts per million when the element is properly encapsulated. The transducers are preferably overlap weighted.

The parameters for a 840 MHz resonator element 10 are listed below in Table 1.

| 840-MHz RESONATOR DESIGN PARAMETERS | |
|---|---|
| Wavelength | $\lambda_o = 3.752\ \mu m$ |
| IDT electrode period | $\lambda_o/2$ |
| IDT electrode width | $\lambda_o/4$ |
| Acoustic aperture | $50\ \lambda_o$ |
| Resonator cavity length | $80.0286\ \lambda_o$ |
| IDT/reflector etch depth | 440 Å ($h/\lambda_o = .012\%$) |
| Reflectors | 900 grooves |
| Transducers | 61 electrodes ($30\ \lambda_o$) |

Note that the acoustic aperture is limited to a maximum of 50 to 80 which is chosen in addition to the overlap weighted of the transducers 18 and 20 in order to completely suppress higher order transverse mode resonances. Note further that the etched depth of the reflectors has been selected to be shallow enough to reduce bulk acoustic mode losses but deep enough to minimize transducer ohmic losses and the necessary length of the reflectors. The length of each transducer 18 and 20 was maximized in order to reduce the input impedance of the device and to facilitate electrical matching.

For minimum noise it is best to avoid the use of the thin layer chromium that is typically used to promote adhesion of the aluminum to the quartz substrate. It is preferred that the metalized electrodes comprises copper and aluminum (2–4 percent copper).

Also shown in FIG. 1 is a third transducer 22 which, in the preferred embodiment, is fabricated on the polished surface 13 to be within the resonant cavity. As detailed hereinafter, the configuration of the transducer 22 relative to transducers 18 and 20 determines the amount of power coupled out of the cavity and provided directly to other circuitry. The reflectors and transducers are fabricated in a conventional manner by replicating the patterns on the polished surface, in etching the grooves, followed by metallization and lift-off. Note that the effect of selectively etching the quartz in a $CF_4$ and $O_2$ plasma is to increase the surface wave reflectivity of the transducer electrodes and a correspondingly decrease the cavity resonant frequency. The resonant frequency of the cavity therefore can be set with an accuracy of at least 5 part per million (ppm).

FIG. 2 schematically illustrates a surface acoustic wave resonator stabilized oscillator circuit 24 comprised of a known surface acoustic wave element 26, inductors 28 and 30, a phase shifter 32 and an amplifier 34. A conventional directional coupled such as directional coupled 36 is additionally included in the circuit 24 to couple a portion of the signals in the circuit to external amplifier 38 without destroying the conditions needed to establish resonance in the circuit 24. As noted above, the directional coupler is available commercially from a number of sources. Enumerated in Table 2 are typical circuit parameters for the oscillator circuit 24.

| | Approximate requirments: |
|---|---|
| Loop amplifier ($A_1$) | Gain = 10 dB ± 1 |
| | Phase Shift 0°, 100–500 MHz |
| | 1 dB comp. point + 10 dBm |
| | Low noise |
| | Phase shift variation (−55 to +95° C.) ± 2° |
| Directional coupler | 10 dB to RF output |
| | Low phase shift variation with temperature |
| Output buffer amplifier (38) | Gain 15 dB |
| | 1 dB comp. point + 15 dBm |
| | Low noise |
| Phase shifter | Meander line + 15° total at 300 MHz with variable tap points |
| Inductors L | 0–100 nh (variable tap) |

The directional coupler 36 of the circuit 24 of FIG. 2 is a discrete element which must be included in any known surface acoustic wave oscillator circuitry. However, as detailed in FIG. 3 a surface acoustic wave resonator element provided according to the present invention obviates the need for an extra component for coupling to the stabilized oscillator circuit.

Figure 3:
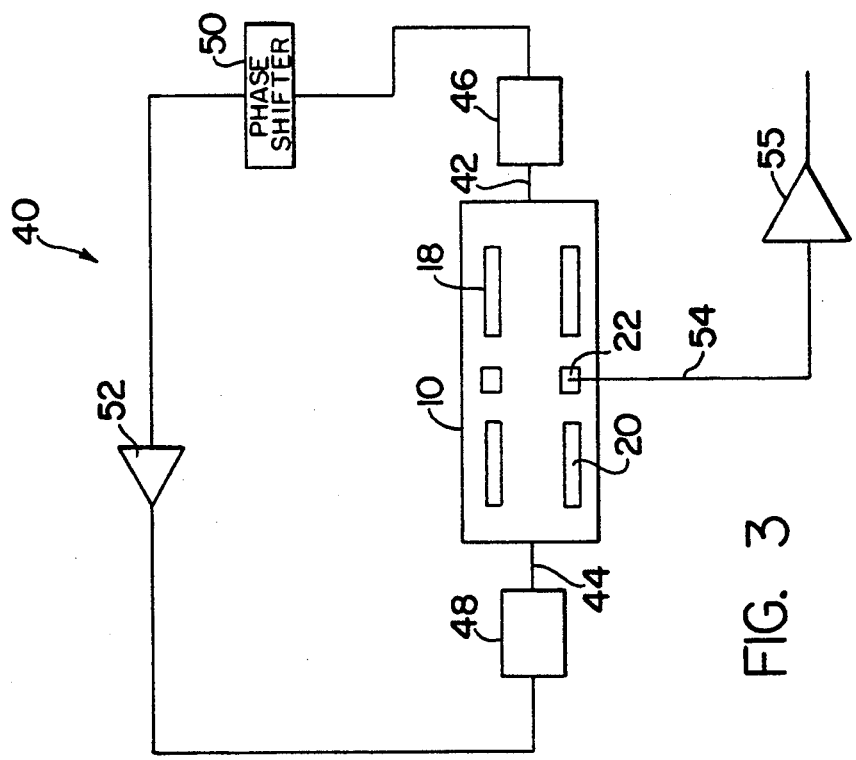
FIG. 3 is an equivalent circuit diagram of a stabilized oscillator circuit having the surface acoustic wave resonator of FIG. 1.

Referring now to FIG. 3 there is schematically illustrated an oscillator circuit 40 having a surface acoustic wave element 10 provided according to the present invention. The surface acoustic wave resonator element 10 is as shown with respect to FIG. 1, with input signals provided on line 42 to transducer 18 and signals indicative of the standing wave within the surface acoustic wave resonator provided on lines 44 from transducer 20. The circuit 40 also comprises inductors 46 and 48 and a phase shifter 50. The output signal from the phase shifter is provided to an amplifier 52 of the type illustrated in FIG. 2. The output signal from the amplifier is then provided back into the inductor 48 and into the surface acoustic wave resonator element to establish resonance. The voltage variable phase shifters used in the preferred embodiment are of the type manufactured by the Merrimac Corporation which utilize varactor diodes to change the transmission phase of the signal as the input voltage is varied. The phase shift around the circuit 40 is adjusted so that oscillation will occur at the desired frequency for phase shifter input voltages from 2 to 4 volts which provides the maximum degree of the voltage phase shift linearity. The phase shifter does degrade the noise performance of the device by approximately 5 dBc/Hz.

Output signals from the transducer 22 are provided on lines 54 to external amplifier 55. The transducer 22 in the surface acoustic wave element 10 is characterized by several parameters which are adjusted in accordance with the amount of energy desired to be removed from the resonant cavity formed by reflectors 14 and 16. As shown in FIG. 1 the transducer 22 has a single period electrode width and has interdigitated electrodes 56, 58, 60 whose length is selected in accordance with the amount of energy desired to be removed. The number of electrodes (corresponding to periods) is also determinative of the energy removed, as is the location of the transducer 22 along the resonant cavity between the transducers 18 and 20.

The transducers 18 and 20 in the preferred embodiment are positioned on the surface 13 relative to the reflectors to be registers with the peaks of the standing wave formed in the cavity to maximize energy coupling. Similarly, the transducer 22 can be positioned spaced from a standing wave maximum to adjust energy coupling from the element:

A disadvantage of the embodiment of FIG. 1 is that the transducer 22 takes up space in the resonant cavity and also places metal within the cavity, both of which increase the aging of the device. Consequently, in some instances it may be desirable to position the transducer on the exterior of the cavity as shown by element 62 in FIG. 4. The element 62 is similar to that shown with respect to FIG. 1 but transducer 64 is positioned on the outside of resonant cavity 65 formed by reflectors 66 and 68. However, since the amount of energy in the desired bandwidth is very limited outside of the resonant cavity 65, transducer 64 is larger than would be needed if it was located within the cavity. Consequently, the number of periods and the length of the interdigitated electrodes are usually increased to increase the coupling of energy. Alternatively, it is possible to reduce the efficiency of the reflector 66 by decreasing the number of gratings. Note however, that a "leaky" cavity by necessity has a lower figure of merit (Q).

The present invention provides for a resonator element in which an output transducer is spaced from a surface acoustic wave anti-node in the resonator cavity to minimize the amount of energy coupling therefrom and provide for sufficient element isolation in a controlled manner. Known surface acoustic wave devices are drawn towards filtering applications which require that the surface acoustic wave element transducer be located in a position which would maximize output coupling, i.e. the anti-node. The present invention is the first which recognizes that an element having a coupling transducer located at a distance spaced from a standing wave anti-node would provide sufficient isolation from external circuitry such that a circuit employing the present element would be sufficiently stable.

In the past, it has been known to reduce coupling from a resonant element by limiting the number of interdigitated fingers in the transducers and/or the amount of overlap those transducer fingers have with one another. It will not, in general, be possible to adequately reduce energy coupling by these techniques to enable a stabilized oscillator circuit of the present type to be made without the incorporation of a separate direction coupler.

In contrast with the present invention, the devices disclosed in Worley U.S. Pat. No. 3,970,970, U.K. patent application No. 2 078 041 to Feldmann et al. and publication to Martin et al. are surface acoustic wave (SAW) filters, not surface acoustic wave resonators stabilized oscillator circuits of the present type. It is well known in the art that surface acoustic wave signal filters are designed to pass electrical signals through a specified pass band. Moreover, these devices are configured to filter a signal with a minimum in signal loss and consequently require maximum energy coupling both to and from the device. Stability of associated circuits is of no concern. The placement of electrodes in a surface acoustic wave resonator cavity is therefore in registration with standing wave anti-nodes in order to maximize the coupling to the cavity with a minimum size transducer.

A surface acoustic resonator stabilized oscillator circuit of the present type that incorporates a surface acoustic wave filer is taught by Worley, Feldmann et al. and Martin et al. would be inoperable, since the circuit would be insufficiently stable in frequency. As noted above, it si precisely for this reason that the prior art circuits incorporate a separate directional coupler. For example, the Feldmann et al. device is characterized by inductors configured with the device resonant cavity and an external cavity transducer for generating output signals from the device. These inductors alter the electrical characteristics of the Feldmann et al. device, rendering it insufficiently stable, and consequently unsuitable for use in stabilized oscillator circuits of the present type.

Similarly, although the invention has been shown and described with respect to a preferred embodiment thereof, it should be understood by those skilled in the art that various other changes, omissions and additions thereto may be made therein without departing from the spirit and scope of the present invention. For example, although shown and described hereinabove with respect to a two port configuration those skilled in the art will recognize that a similar element having a single input/output transducer (port) can be adapted to have a transducer for external coupling directly to the resonant cavity.

I claim:

1. A surface acoustic wave (SAW) element for use in a resonant electrical circuit, said element comprising:
    a piezoelectric crystal having a polished surface;
    a transducer means formed on said polished surface for receiving electrical signals, launching surface acoustic waves along said polished surface and generating electrical signals at a resonant frequency corresponding to standing surface acoustic waves;
    a resonator means configured with said polished surface to form a resonant cavity within said surface coupled to receive said surface acoustic waves for generating said standing surface acoustic waves at said resonant frequency having acoustical energy associated therewith with at least one amplitude maximum and minimum along said resonance cavity;
    a supplemental transducer means formed on said polished surface within said resonant cavity at a position spaced from said wave maximum selected in dependence on a desired magnitude of said acoustic energy to be coupled from said standing surface acoustic waves, said supplemental transducer means for generating electrical signals corresponding to said selected acoustic energy magnitude of said standing surface acoustic waves in said resonant cavity.

2. A surface acoustic wave (SAW) element for use in a resonant electrical circuit, said element comprising:
    a piezoelectric crystal having a polished surface;
    a first transducer means formed on said polished surface for receiving electrical signals and launching surface acoustic waves therealong;
    a resonator means configured with said polished surface to form a resonant cavity within said surface coupled to receive said surface acoustic waves, said resonator for generating standing surface acoustic waves at a resonant frequency having acoustical energy associated therewith with at least one amplitude maximum along said resonant cavity;
    a second transducer means formed on said polished surface opposed to said first transducer means for generating electrical signals at said resonant frequency from said standing surface acoustic waves;

a third transducer means formed on said polished surface coupled within said resonant cavity at a position spaced from said wave maximum selected in dependence on a desired magnitude of said acoustic energy to be coupled from said standing surface acoustic waves, for generating electrical signals corresponding to a selected magnitude of the acoustic energy of said standing surface acoustic waves in said resonant cavity.

3. The element of claim 2 wherein said resonator means further comprises etched grooves formed in said polished surface at opposed ends of said resonator cavity.

4. The element of claim 2 wherein said first and second transducer means further comprises interdigitated aluminum transducers formed in recessed grooves on said polished surface.

5. The element of claim 4 wherein said first and second transducer means are comprised of aluminum with between 2% and 4% copper.

6. A surface acoustic wave resonator stabilized oscillator circuit, comprising:

an amplifier means; and a surface acoustic wave resonator element including a piezoelectric crystal having a polished surface;

a transducer means formed on said polished surface for receiving electrical signals from said amplifier means, launching surface acoustic waves along said polished surface and providing electrical signals to said amplifier means at a resonant frequency corresponding to standing surface acoustic waves;

a resonator means configured with said polished surface to form a resonant cavity coupled to receive said surface acoustic waves for generating standing acoustic waves at said resonant frequency having acoustical energy associated therewith with at least one amplitude maximum along said resonant cavity;

a supplemental transducer means formed on said polished surface within said resonant cavity at a position spaced from said wave maximum selected in dependence on a desired magnitude of said acoustic energy to be coupled from said standing surface acoustic waves, said supplemental transducer means for generating electrical signals corresponding to said selected acoustic energy magnitude of said standing surface acoustic waves in said resonant cavity.

7. The circuit of claim 6 further comprising a means for phase shifting said transducer means output signals.

8. The circuit of claim 6 further comprising a means for amplifying said supplemental transducer means output signal.

9. The element of claim 6 wherein said first and second transducer means further comprise interdigitated aluminum transducers formed in recessed grooves on said polished surface.

10. The element of claim 6 wherein said resonator means further comprises etched grooves formed in said polished surface at opposed ends of said resonator cavity.

* * * * *